US008072357B2

(12) United States Patent
Chan et al.

(10) Patent No.: US 8,072,357 B2
(45) Date of Patent: *Dec. 6, 2011

(54) METHOD AND SYSTEM FOR REDUCING CONTEXTS FOR CONTEXT BASED COMPRESSION SYSTEMS

(75) Inventors: Steven Chan, Waterloo (CA); En-Hui Yang, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 104 days.

This patent is subject to a terminal disclaimer.

(21) Appl. No.: 12/566,815

(22) Filed: Sep. 25, 2009

(65) Prior Publication Data

US 2010/0013677 A1 Jan. 21, 2010

Related U.S. Application Data

(63) Continuation of application No. 12/040,149, filed on Feb. 29, 2008, now Pat. No. 7,616,132.

(60) Provisional application No. 60/950,712, filed on Jul. 19, 2007.

(51) Int. Cl.
*H03M 5/00* (2006.01)
(52) U.S. Cl. .............................. 341/55; 704/9
(58) Field of Classification Search .............. 341/50–90; 704/9–20
See application file for complete search history.

(56) References Cited

U.S. PATENT DOCUMENTS

| 5,045,852 | A | * | 9/1991 | Mitchell et al. ................. 341/51 |
| 5,054,852 | A | | 10/1991 | Tholkes |
| 5,710,562 | A | | 1/1998 | Gormish et al. |
| 5,818,877 | A | | 10/1998 | Tsai et al. |
| 5,886,655 | A | * | 3/1999 | Rust ............................. 341/107 |
| 6,400,289 | B1 | | 6/2002 | Banerji |
| 6,762,699 | B1 | * | 7/2004 | Yang ............................. 341/51 |
| 6,801,141 | B2 | * | 10/2004 | Yang et al. ..................... 341/51 |
| 7,616,132 | B2 | * | 11/2009 | Chan et al. ..................... 341/50 |
| 2007/0120712 | A1 | | 5/2007 | Cai et al. |

OTHER PUBLICATIONS

European Patent Application No. 08714705.4, European Search Report dated Jul. 1, 2010.
Mahoney, "Adaptive Weighing of Context Models for Lossless Data Compression", Internet Citation (Dec. 31, 2005), retrieved from the Internet on Dec. 22, 2007, 6 pages.

(Continued)

*Primary Examiner* — Lam T Mai
(74) *Attorney, Agent, or Firm* — Leslie Anne Kinsman; Borden Ladner Gervais LLP

(57) ABSTRACT

For context based compression techniques, for example Context Based YK compression, a method and system for grouping contexts from a given context model together to create a new context model that has fewer contexts, but retains acceptable compression gains compared to the context model with more contexts is provided. According to an exemplary embodiment a set of files that are correlated to the file to be compressed (hereafter called training files) are read to determine, for an initial context model, the empirical statistics of contexts and symbols. In some embodiments, this includes determining the estimated joint and conditional probabilities of the various contexts and symbols (or blocks of symbols). The initial context model is then reduced to a desired number of contexts, for example, by applying a grouping function g to the original set of contexts to obtain a new and smaller set of contexts. In some embodiments the step of applying a grouping function comprises iteratively grouping a pair of contexts together to form a grouped context, wherein each grouped context represents a local minimum based on the empirical statistics.

16 Claims, 8 Drawing Sheets

OTHER PUBLICATIONS

Chen et al, "A Low-Cost CAVLC Encoder", IEICE Trans. Electron, vol. E89-C, No. 12, Dec. 2006, pp. 1950-1953.
Todd et al., "Parameter Reduction and Context Selection for Compression of Gray-Scale Images", IBM, J. Res. Develop, vol. 29, No. 2, Mar. 1985, pp. 188-193.
International Search Report for PCT Patent Application No. PCT/CA2008/000385, dated Jun. 4, 2008.
Banerji et al., "Architecture for Efficient Implementation of the YK Lossless Data Compression Algorithm", Proceedings of the Data Compression Conference (DCC'01), IEEE, 2001.
Bookstein et al., "An Overhead Reduction Technique For Mega-State Compression Schemes", May 1, 1997, pp. 1-28.
Yang et al., "Efficient Universal Lossless Data Compresion Algorithms Based on a Greedy Sequential Grammar Transform—Part One: Without Context Models", IEEE Transactions on Information Theory, vol. 46, No. 3, May 2000, pp. 755-777.
Yang et al., "Efficient Universal Lossless Data Compresion Algorithms Based on a Greedy Sequential Grammar Transform—Part Two: Without Context Models", IEEE Transactions on Information Theory, vol. 49, No. 11, Nov. 2003, pp. 2874-2894.
Feregrino, "High Performance PPMC Compression Algorithm", IEEE, 2003, pp. 1-8.
U.S. Appl. No. 12/040,149: Notice of Allowance dated Jun. 30, 2009.
http://en.wikipedia.org/w/index.php, published at least as early as Mar. 7, 2007, pp. 1-8.

* cited by examiner

METHOD AND SYSTEM FOR REDUCING CONTEXTS FOR CONTEXT BASED COMPRESSION SYSTEMS

CROSS REFERENCE TO RELATED APPLICATION

This is a continuation of U.S. application Ser. No. 12/040,149, filed Feb. 29, 2008, which claims the priority of the provisional patent application No. 60/950,712, filed on Jul. 19, 2007, the contents of which are incorporated herein by reference.

A portion of the disclosure of this patent document contains material which is subject to copyright protection. The copyright owner has no objection to the facsimile reproduction by any one of the patent document or patent disclosure, as it appears in the Patent and Trademark Office patent file or records, but otherwise reserves all copyrights whatsoever.

FIELD OF THE INVENTION

The present invention relates generally to context models. More particularly, the present invention relates to context based compression techniques.

BACKGROUND OF THE INVENTION

In "*Efficient Universal Lossless Data Compression Algorithms Based on a Greedy Sequential Grammar Transform—Part One: Without Context Models*", E.-h. Yang and J. C. Kieffer, *IEEE Transactions on Information Theory*, VOL. 46, NO. 3, May 2000, pp. 755-777, and "Grammar based codes: A new class of universal lossless source codes," J. C. Kieffer and E.-h. Yang, IEEE Transactions on Information Theory, VOL. 46, pp. 737-754, May 2000, a compression algorithm which uses a grammar transform to construct a sequence of irreducible context free grammars to compress a data sequence is described. The entire contents of both are hereby incorporated by reference. This algorithm has been called the YK compression algorithm in the art, and will be so referred herein. The YK compression algorithm describes a set of reduction rules for producing an irreducible grammar for encoding an original data sequence. This grammar can then be used to recover the original data sequence.

In many instances, such as compression of web pages, java applets, or text files, there is often some a priori knowledge about the data sequences being compressed. This knowledge can often take the form of so-called "context models." Accordingly, context based compression techniques are particularly efficient for encoding web pages in which the content of a web page changes often, while the underlying structure of the web page remains approximately constant. The relative consistency of the underlying structure provides the predictable context for the data as it is compressed.

U.S. Pat. No. 6,801,141, issued on Oct. 5, 2004 to En-Hui Yang and Da-Ke He, and "*Efficient Universal Lossless Data Compression Algorithms Based on a Greedy Sequential Grammar Transform—Part Two: With Context Models*", En-Hui Yang and Da-Ke He, *IEEE Transactions on Information Theory*, VOL. 49, NO. 11, November 2003, pp. 2874-2894 both describe an improvement to the YK compression algorithm by using contexts, and both of which are hereby incorporated by reference in their entirety—as are the references cited therein. We will refer to the methods and techniques described therein as context based YK compression (CBYK).

One aspect of the CBYK described therein relates to a method of sequentially transforming an original data sequence associated with a known context model into an irreducible context-dependent grammar, and recovering the original data sequence from the grammar. The method includes the steps of parsing a substring from the sequence, generating an admissible context-dependent grammar based on the parsed substring, applying a set of reduction rules to the admissible context dependent grammar to generate a new irreducible context-dependent grammar, and repeating these steps until the entire sequence is encoded. In addition, a set of reduction rules based on pairs of variables and contexts represents the irreducible context-dependent grammar such that the pairs represent non-overlapping repeated patterns and contexts of the data sequence.

CBYK compression can provide significant compression gains over the context-free YK compression algorithm, especially when it is combined with interactive compression. In brief, context based YK compression uses the context as a form of predictor of the next parsed symbol or phrase and the corresponding estimated conditional probability for coding, in order to achieve good compression. In theory, the better the context model used by the CBYK, the more likely the compression rate will be optimized.

In general, for (CBYK) compression, a good context model acts as a good form of predictor of the next parsed symbol or phrase. In this regard, improvements to the context model can increase the effectiveness of the compression. However, if improving the context model increases the size of the context model, practical limits need to be considered.

It has been found that the memory requirements used to process the CBYK increase significantly with the size of the context model. For example, if a context model is not chosen properly, the number of grammar variables can be significantly higher than the number in context-free YK resulting in higher memory usage. If the memory usage of CBYK exceeds the constraints or the available capacity, then the use of CBYK is not desirable regardless of how significant the increase in compression gain is. Depending on the application and the devices running the CBYK, even a simple context model, such as using the last byte of the previous parsed phrase as the context, can exceed memory constraints. As the context length grows, the number of contexts grows exponentially. On the other hand, since CBYK uses in general more resources than context-free YK, it would not be preferable without a benefit in compression gain.

Therefore, it is desirable to provide a method for creating a context model, for example, for use with CBYK, that provides a suitable trade-off between memory requirements and compression gain. In particular, it is desirable to provide a context model that uses less memory, but still retains acceptable compression gains, compared to larger context models.

BRIEF DESCRIPTION OF THE DRAWINGS

Aspects and features of the present invention will become apparent to those ordinarily skilled in the art upon review of the following description of specific embodiments of the invention in conjunction with the accompanying figures. For a better understanding of the various embodiments described herein and to show more clearly how they may be carried into effect, reference will now be made, by way of example only, to the accompanying drawings which show at least one exemplary embodiment and in which.

DETAILED DESCRIPTION OF PREFERRED EMBODIMENTS

Figure 1:
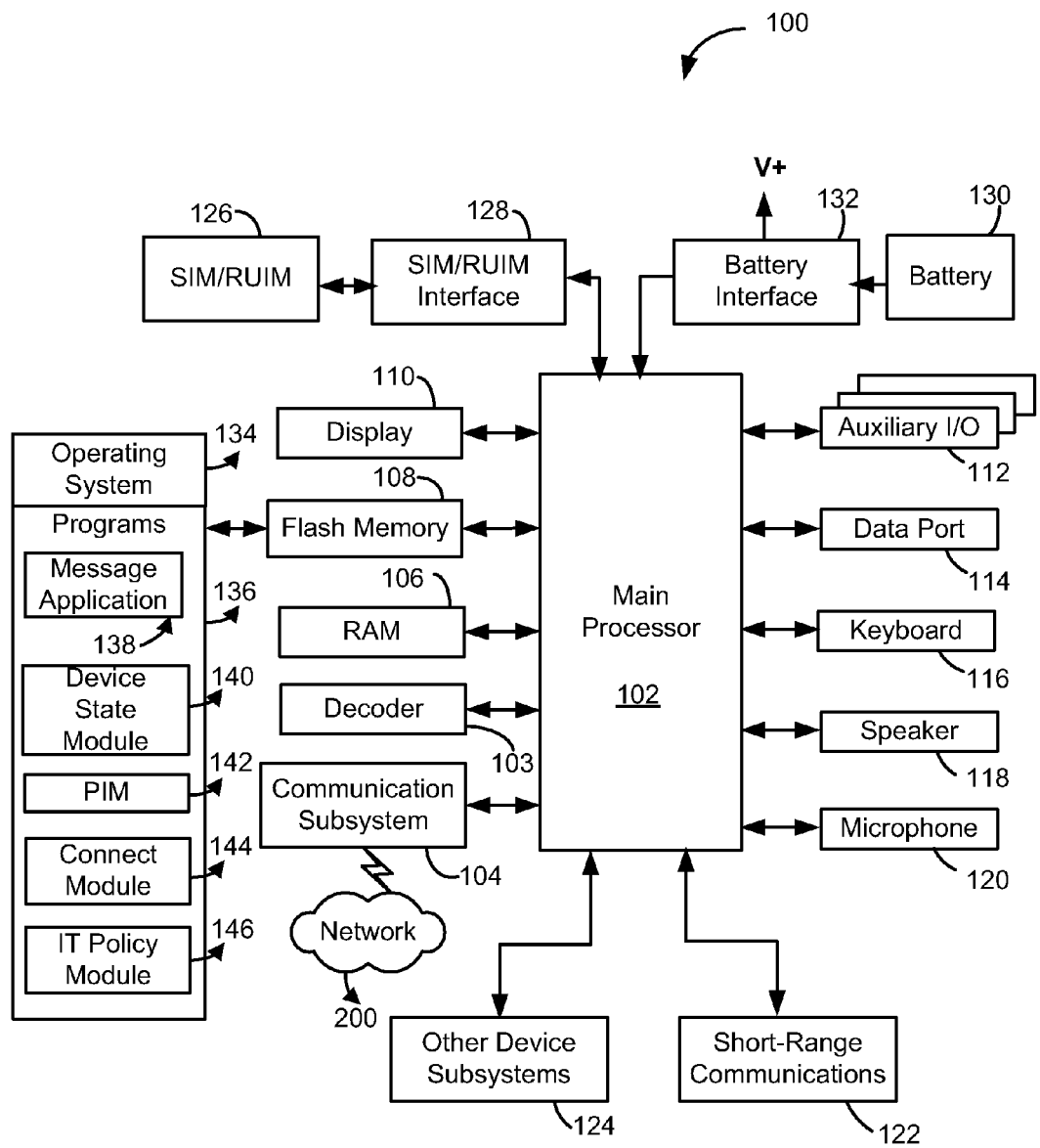
FIG. 1 is a block diagram of an exemplary embodiment of a mobile device.

In the following description, for purposes of explanation, numerous details are set forth in order to provide a thorough understanding of the present invention. However, it will be apparent to one skilled in the art that these specific details are not required in order to practice the present invention. It will be appreciated that for simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. In other instances, well-known electrical structures and circuits are not shown in block diagram form in order not to obscure the present invention. For example, specific details are not provided as to whether the embodiments of the invention described herein are implemented as a software routine, hardware circuit, firmware, or a combination thereof. Also, the description is not to be considered as limiting the scope of the embodiments described herein.

Embodiments of the invention may be represented as a software product stored in a machine-readable medium (also referred to as a computer-readable medium, a processor-readable medium, or a computer usable medium having a computer-readable program code embodied therein). The machine-readable medium may be any suitable tangible medium, including magnetic, optical, or electrical storage medium including a diskette, compact disk read only memory (CD-ROM), memory device (volatile or non-volatile), or similar storage mechanism. The machine-readable medium may contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention may also be stored on the machine-readable medium. Software running from the machine-readable medium may interface with circuitry to perform the described tasks.

We describe herein methods and systems for providing a context model, for example for CBYK. Preferred embodiments will be described with reference to a specific example of a CBYK compression process, to which the discussed embodiments are well suited. However, it should be noted that the invention is not so limited, and is more generally applicable for other context based compression techniques, or other systems which use such a context model. A context is the a priori information (based on previously processed data) that is used to compress the next parsed phrase. A context model defines the set of possible contexts, known as the context set, and the method for generating the next context. The context sequence is the sequence of contexts that is generated from a specific parsing of a data sequence. A couple of examples are presented to illustrate these terms:

Example 1

Consider the example that the binary sequence $X=b_0 b_1 b_2 \ldots = 101110101000111$ is to be compressed. Assume that the sequence will be parsed one bit at a time, and the context model is the last two bits, i.e. the context set=$\{00, 01, 10, 11\}$ and the next context is $c_{i+1}=b_{i-1}, b_i$. Let the initial context be 00. Denote the bit $b_i$ that is parsed and the context for that bit $c_i$ be represented by $b_i | c_i$. The sequence of parsed symbols is 1|00, 0|01, 1|10, 1|01, 1|11, 0|11, 1|10, 0|01, 1|10, 0|01, 0|10, 0|00, 1|00, 1|01, 1|11. The context sequence is 00, 01, 10, 01, 11, 11, 10, 01, 10, 01, 10, 00, 00, 01, 11.

Example 2

Consider another example where the same binary sequence as above is to be compressed. However, the context model is defined by the context set $\{00, 10, 1\}$ and the next context is defined by:

$$c_{i+1} = \begin{cases} 1 & \text{if } b_i = 1 \\ b_{i-1} b_i & \text{otherwise.} \end{cases}$$

The sequence of parsed symbols is 1|00, 0|1, 1|10, 1|1, 1|1, 0|1, 1|10, 0|1, 1|10, 0|1, 0|10, 0|00, 1|00, 1|1, 1|1. The context sequence is 00, 1, 10, 1, 1, 1, 10, 1, 10, 1, 10, 00, 00, 1, 1.

One aspect of the invention provides a method of generating a context model to be used for context dependent based compression comprising: (a) determining file categorization criteria for a file to be compressed; (b) determining an initial context model including an initial value for a current number of contexts and an initial context set based on the file categorization criteria; (c) determining, for the initial context model, empirical statistics of contexts and symbols; (d) using the empirical statistics to reduce the current number of contexts to a desired number of contexts; and (e) generating the context model for mapping data elements to a set of contexts of size equal to said desired number of contexts.

Another aspect of the invention provides a method of developing a context model for use in a context-based data compression process comprising: (a) determining an initial context model including an initial set of contexts containing a first number of contexts for each of at least one data file; and (b) forming a reduced set of contexts with a smaller number of contexts for each of said at least one data file by combining contexts in such a manner as to reduce the memory requirements necessary for implementing said context-based data compression process while still achieving a satisfactory compression rate. According to one embodiment consistent with this aspect, step (a) comprises determining an initial set of contexts and empirical statistics for each of a plurality of categories of files and wherein step (b) comprises applying a grouping function to the each initial set of contexts to combine the contexts into a smaller set of contexts for each file type based on said empirical statistics for each file type. According to one example, the step of applying a grouping function comprises iteratively grouping a pair of contexts together to form a grouped context, wherein each grouped context represents a local minimum based on said empirical statistics.

Another aspect of the invention provides a system for compressing an input string $x=x_1 x_2 \ldots x_m$ according to CBYK comprising, said input string having an associated context set $\epsilon=\{c^1, c^2, \ldots, c^j\}$, said system comprising: (a) a parser for parsing said input string to produce a substring; (b) a context generator coupled to a first output of said parser, said context generator accessing a mapping file M defining a grouping function g reducing said context set $\epsilon$ to a reduced set of contexts $\hat{\epsilon}=\{\hat{c}^1, \hat{c}^2, \ldots, \hat{c}^k\}$ with k<j and said context generator using said context set $\epsilon=\{c^1, c^2, \ldots, c^j\}$, and said mapping file M to determine the next context, which is supplied to said parser, wherein the next context $\hat{c}_{i+1}$ is determined from $\hat{c}_{i+1}=g(c_{i+1})$, wherein $(c_{i+1})$ is determined from $x_i$ after $x_i$ is parsed; (c) a context dependent grammar updating device coupled to a second output of said parser and also coupled to the output of said context generator for producing an updated context-dependent grammar G; (d) a Context dependent Grammar Coder coupled to the output of said context dependent grammar updating device for producing a compressed binary code word from which the original input string can be recovered.

Another aspect of the invention provides a computer program product stored in a machine readable medium comprising instructions, which when executed by a processor of a device, causes said device to carry out the methods described herein.

We will discuss the methods and systems with reference to a particular exemplary application for which the embodiments of the invention are well suited, namely a wireless network where files are compressed for transmission to a mobile wireless communication device, hereafter referred to as a mobile device. Examples of applicable communication devices include pagers, cellular phones, cellular smartphones, wireless organizers, personal digital assistants, computers, laptops, handheld wireless communication devices, wirelessly enabled notebook computers and the like.

The mobile device is a two-way communication device with advanced data communication capabilities including the capability to communicate with other mobile devices or computer systems through a network of transceiver stations. The mobile device may also have the capability to allow voice communication. Depending on the functionality provided by the mobile device, it may be referred to as a data messaging device, a two-way pager, a cellular telephone with data messaging capabilities, a wireless Internet appliance, or a data communication device (with or without telephony capabilities). To aid the reader in understanding the structure of the mobile device and how it communicates with other devices and host systems, reference will now be made to FIGS. 1 through 4.

Referring first to FIG. 1, shown therein is a block diagram of an exemplary embodiment of a mobile device 100. The mobile device 100 includes a number of components such as a main processor 102 that controls the overall operation of the mobile device 100. Communication functions, including data and voice communications, are performed through a communication subsystem 104. Data received by the mobile device 100 can be decompressed and decrypted by decoder 103, operating according to any suitable decompression techniques (e.g. YK decompression, and other known techniques) and encryption techniques (e.g. using an encryption techniques such as Data Encryption Standard (DES), Triple DES, or Advanced Encryption Standard (AES)). The communication subsystem 104 receives messages from and sends messages to a wireless network 200. In this exemplary embodiment of the mobile device 100, the communication subsystem 104 is configured in accordance with the Global System for Mobile Communication (GSM) and General Packet Radio Services (GPRS) standards. The GSM/GPRS wireless network is used worldwide and it is expected that these standards will be superseded eventually by Enhanced Data GSM Environment (EDGE) and Universal Mobile Telecommunications Service (UMTS). New standards are still being defined, but it is believed that they will have similarities to the network behavior described herein, and it will also be understood by persons skilled in the art that the embodiments described herein are intended to use any other suitable standards that are developed in the future. The wireless link connecting the communication subsystem 104 with the wireless network 200 represents one or more different Radio Frequency (RF) channels, operating according to defined protocols specified for GSM/GPRS communications. With newer network protocols, these channels are capable of supporting both circuit switched voice communications and packet switched data communications.

Although the wireless network 200 associated with mobile device 100 is a GSM/GPRS wireless network in one exemplary implementation, other wireless networks may also be associated with the mobile device 100 in variant implementations. The different types of wireless networks that may be employed include, for example, data-centric wireless networks, voice-centric wireless networks, and dual-mode networks that can support both voice and data communications over the same physical base stations. Combined dual-mode networks include, but are not limited to, Code Division Multiple Access (CDMA) or CDMA2000 networks, GSM/GPRS networks (as mentioned above), and future third-generation (3G) networks like EDGE and UMTS. Some other examples of data-centric networks include WiFi 802.11, Mobitex™ and DataTAC™ network communication systems. Examples of other voice-centric data networks include Personal Communication Systems (PCS) networks like GSM and Time Division Multiple Access (TDMA) systems. The main processor 102 also interacts with additional subsystems such as a Random Access Memory (RAM) 106, a flash memory 108, a display 110, an auxiliary input/output (I/O) subsystem 112, a data port 114, a keyboard 116, a speaker 118, a microphone 120, short-range communications 122 and other device subsystems 124.

Some of the subsystems of the mobile device 100 perform communication-related functions, whereas other subsystems may provide "resident" or on-device functions. By way of example, the display 110 and the keyboard 116 may be used for both communication-related functions, such as entering a text message for transmission over the network 200, and device-resident functions such as a calculator or task list.

The mobile device 100 can send and receive communication signals over the wireless network 200 after required network registration or activation procedures have been completed. Network access is associated with a subscriber or user of the mobile device 100. To identify a subscriber, the mobile device 100 requires a SIM/RUIM card 126 (i.e. Subscriber Identity Module or a Removable User Identity Module) to be inserted into a SIM/RUIM interface 128 in order to communicate with a network. The SIM card or RUIM 126 is one type of a conventional "smart card" that can be used to identify a subscriber of the mobile device 100 and to personalize the mobile device 100, among other things. Without the SIM card 126, the mobile device 100 is not fully operational for communication with the wireless network 200. By inserting the SIM card/RUIM 126 into the SIM/RUIM interface 128, a subscriber can access all subscribed services. Services may include: web browsing and messaging such as e-mail, voice mail, Short Message Service (SMS), and Multimedia Messaging Services (MMS). More advanced services may include: point of sale, field service and sales force automation. The SIM card/RUIM 126 includes a processor and memory for storing information. Once the SIM card/RUIM 126 is inserted into the SIM/RUIM interface 128, it is coupled to the main processor 102. In order to identify the subscriber, the SIM card/RUIM 126 can include some user parameters such as an International Mobile Subscriber Identity (IMSI). An advantage of using the SIM card/RUIM 126 is that a subscriber is not necessarily bound by any single physical mobile device. The SIM card/RUIM 126 may store additional subscriber information for a mobile device as well, including datebook (or calendar) information and recent call information. Alternatively, user identification information can also be programmed into the flash memory 108.

The mobile device 100 is a battery-powered device and includes a battery interface 132 for receiving one or more rechargeable batteries 130. In at least some embodiments, the battery 130 can be a smart battery with an embedded microprocessor. The battery interface 132 is coupled to a regulator (not shown), which assists the battery 130 in providing power V+ to the mobile device 100. Although current technology makes use of a battery, future technologies such as micro fuel cells may provide the power to the mobile device 100.

The mobile device 100 also includes an operating system 134 and software components 136 to 146 which are described in more detail below. The operating system 134 and the software components 136 to 146 that are executed by the main processor 102 are typically stored in a persistent store such as the flash memory 108, which may alternatively be a read-only memory (ROM) or similar storage element (not shown). Those skilled in the art will appreciate that portions of the operating system 134 and the software components 136 to 146, such as specific device applications, or parts thereof, may be temporarily loaded into a volatile store such as the RAM 106. Other software components can also be included, as is well known to those skilled in the art.

The subset of software applications 136 that control basic device operations, including data and voice communication applications, will normally be installed on the mobile device 100 during its manufacture. Other software applications include a message application 138 that can be any suitable software program that allows a user of the mobile device 100 to send and receive electronic messages. Various alternatives exist for the message application 138 as is well known to those skilled in the art. Messages that have been sent or received by the user are typically stored in the flash memory 108 of the mobile device 100 or some other suitable storage element in the mobile device 100. In at least some embodiments, some of the sent and received messages may be stored remotely from the device 100 such as in a data store of an associated host system that the mobile device 100 communicates with.

The software applications can further include a device state module 140, a Personal Information Manager (PIM) 142, and other suitable modules (not shown). The device state module 140 provides persistence, i.e. the device state module 140 ensures that important device data is stored in persistent memory, such as the flash memory 108, so that the data is not lost when the mobile device 100 is turned off or loses power.

The PIM 142 includes functionality for organizing and managing data items of interest to the user, such as, but not limited to, e-mail, contacts, calendar events, voice mails, appointments, and task items. A PIM application has the ability to send and receive data items via the wireless network 200. PIM data items may be seamlessly integrated, synchronized, and updated via the wireless network 200 with the mobile device subscriber's corresponding data items stored and/or associated with a host computer system. This functionality creates a mirrored host computer on the mobile device 100 with respect to such items. This can be particularly advantageous when the host computer system is the mobile device subscriber's office computer system.

The mobile device 100 also includes a connect module 144, and an information technology (IT) policy module 146. The connect module 144 implements the communication protocols that are required for the mobile device 100 to communicate with the wireless infrastructure and any host system, such as an enterprise system, that the mobile device 100 is authorized to interface with. Examples of a wireless infrastructure and an enterprise system are given in FIGS. 3 and 4, which are described in more detail below.

The connect module 144 includes a set of APIs that can be integrated with the mobile device 100 to allow the mobile device 100 to use any number of services associated with the enterprise system. The connect module 144 allows the mobile device 100 to establish an end-to-end secure, authenticated communication pipe with the host system. A subset of applications for which access is provided by the connect module 144 can be used to pass IT policy commands from the host system to the mobile device 100. This can be done in a wireless or wired manner. These instructions can then be passed to the IT policy module 146 to modify the configuration of the device 100. Alternatively, in some cases, the IT policy update can also be done over a wired connection.

Other types of software applications can also be installed on the mobile device 100. These software applications can be third party applications, which are added after the manufacture of the mobile device 100. Examples of third party applications include games, calculators, utilities, etc.

The additional applications can be loaded onto the mobile device 100 through at least one of the wireless network 200, the auxiliary I/O subsystem 112, the data port 114, the short-range communications subsystem 122, or any other suitable device subsystem 124. This flexibility in application installation increases the functionality of the mobile device 100 and may provide enhanced on-device functions, communication-related functions, or both. For example, secure communication applications may enable electronic commerce functions and other such financial transactions to be performed using the mobile device 100.

The data port 114 enables a subscriber to set preferences through an external device or software application and extends the capabilities of the mobile device 100 by providing for information or software downloads to the mobile device 100 other than through a wireless communication network. The alternate download path may, for example, be used to load an encryption key onto the mobile device 100 through a direct and thus reliable and trusted connection to provide secure device communication.

The data port 114 can be any suitable port that enables data communication between the mobile device 100 and another computing device. The data port 114 can be a serial or a parallel port. In some instances, the data port 114 can be a USB port that includes data lines for data transfer and a supply line that can provide a charging current to charge the battery 130 of the mobile device 100.

The short-range communications subsystem 122 provides for communication between the mobile device 100 and different systems or devices, without the use of the wireless network 200. For example, the subsystem 122 may include an infrared device and associated circuits and components for short-range communication. Examples of short-range communication standards include standards developed by the Infrared Data Association (IrDA), Bluetooth, and the 802.11 family of standards developed by IEEE.

In use, a received signal such as a text message, an e-mail message, or web page download will be processed by the communication subsystem 104 and input to the main processor 102. The main processor 102 will then process the received signal for output to the display 110 or alternatively to the auxiliary I/O subsystem 112. A subscriber may also compose data items, such as e-mail messages, for example, using the keyboard 116 in conjunction with the display 110 and possibly the auxiliary I/O subsystem 112. The auxiliary subsystem 112 may include devices such as: a touch screen, mouse, track ball, infrared fingerprint detector, or a roller wheel with dynamic button pressing capability. The keyboard 116 is preferably an alphanumeric keyboard and/or telephone-type keypad. However, other types of keyboards may also be used. A composed item may be transmitted over the wireless network 200 through the communication subsystem 104.

For voice communications, the overall operation of the mobile device 100 is substantially similar, except that the received signals are output to the speaker 118, and signals for transmission are generated by the microphone 120. Alternative voice or audio I/O subsystems, such as a voice message recording subsystem, can also be implemented on the mobile device 100. Although voice or audio signal output is accomplished primarily through the speaker 118, the display 110 can also be used to provide additional information such as the identity of a calling party, duration of a voice call, or other voice call related information.

Figure 2:
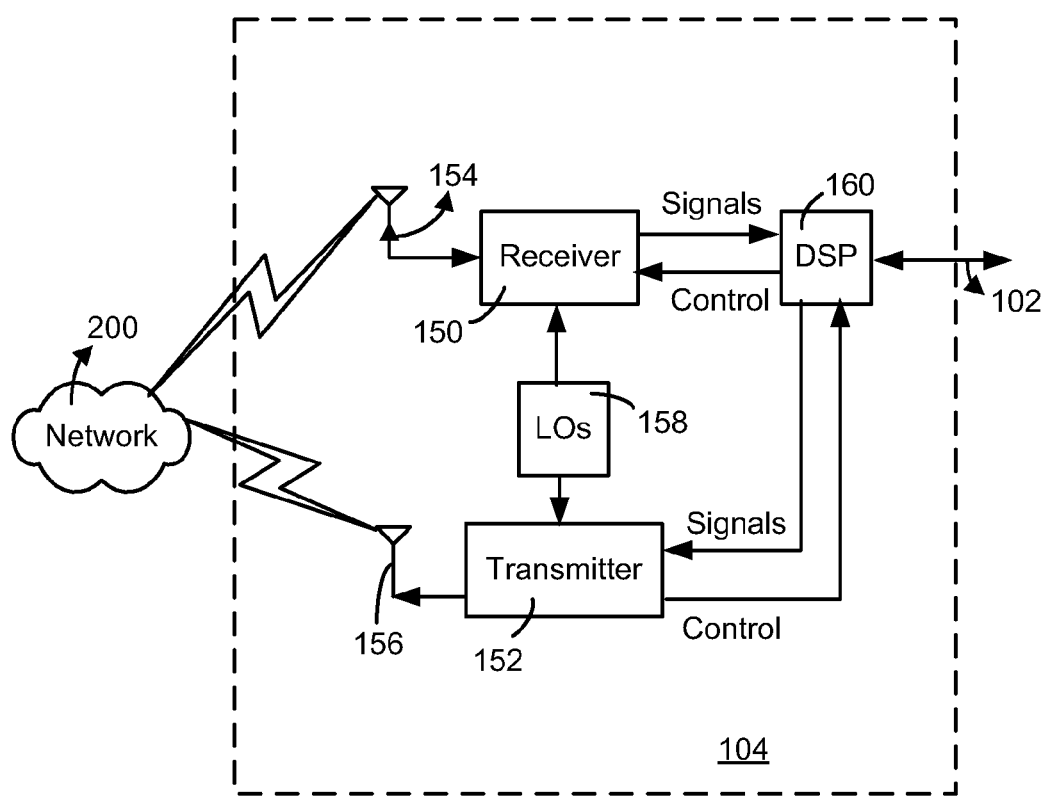
FIG. 2 is a block diagram of an exemplary embodiment of a communication subsystem component of the mobile device of FIG. 1.

Referring now to FIG. 2, an exemplary block diagram of the communication subsystem component 104 is shown. The communication subsystem 104 includes a receiver 150, a transmitter 152, as well as associated components such as one or more embedded or internal antenna elements 154 and 156, Local Oscillators (LOs) 158, and a processing module such as a Digital Signal Processor (DSP) 160. The particular design of the communication subsystem 104 is dependent upon the communication network 200 with which the mobile device 100 is intended to operate. Thus, it should be understood that the design illustrated in FIG. 2 serves only as one example.

Signals received by the antenna 154 through the wireless network 200 are input to the receiver 150, which may perform such common receiver functions as signal amplification, frequency down conversion, filtering, channel selection, and analog-to-digital (A/D) conversion. A/D conversion of a received signal allows more complex communication functions such as demodulation and decoding to be performed in the DSP 160. In a similar manner, signals to be transmitted are processed, including modulation and encoding, by the DSP 160. These DSP-processed signals are input to the transmitter 152 for digital-to-analog (D/A) conversion, frequency up conversion, filtering, amplification and transmission over the wireless network 200 via the antenna 156. The DSP 160 not only processes communication signals, but also provides for receiver and transmitter control. For example, the gains applied to communication signals in the receiver 150 and the transmitter 152 may be adaptively controlled through automatic gain control algorithms implemented in the DSP 160.

The wireless link between the mobile device 100 and the wireless network 200 can contain one or more different channels, typically different RF channels, and associated protocols used between the mobile device 100 and the wireless network 200. An RF channel is a limited resource that must be conserved, typically due to limits in overall bandwidth and limited battery power of the mobile device 100.

When the mobile device 100 is fully operational, the transmitter 152 is typically keyed or turned on only when it is transmitting to the wireless network 200 and is otherwise turned off to conserve resources. Similarly, the receiver 150 is periodically turned off to conserve power until it is needed to receive signals or information (if at all) during designated time periods.

Figure 3:
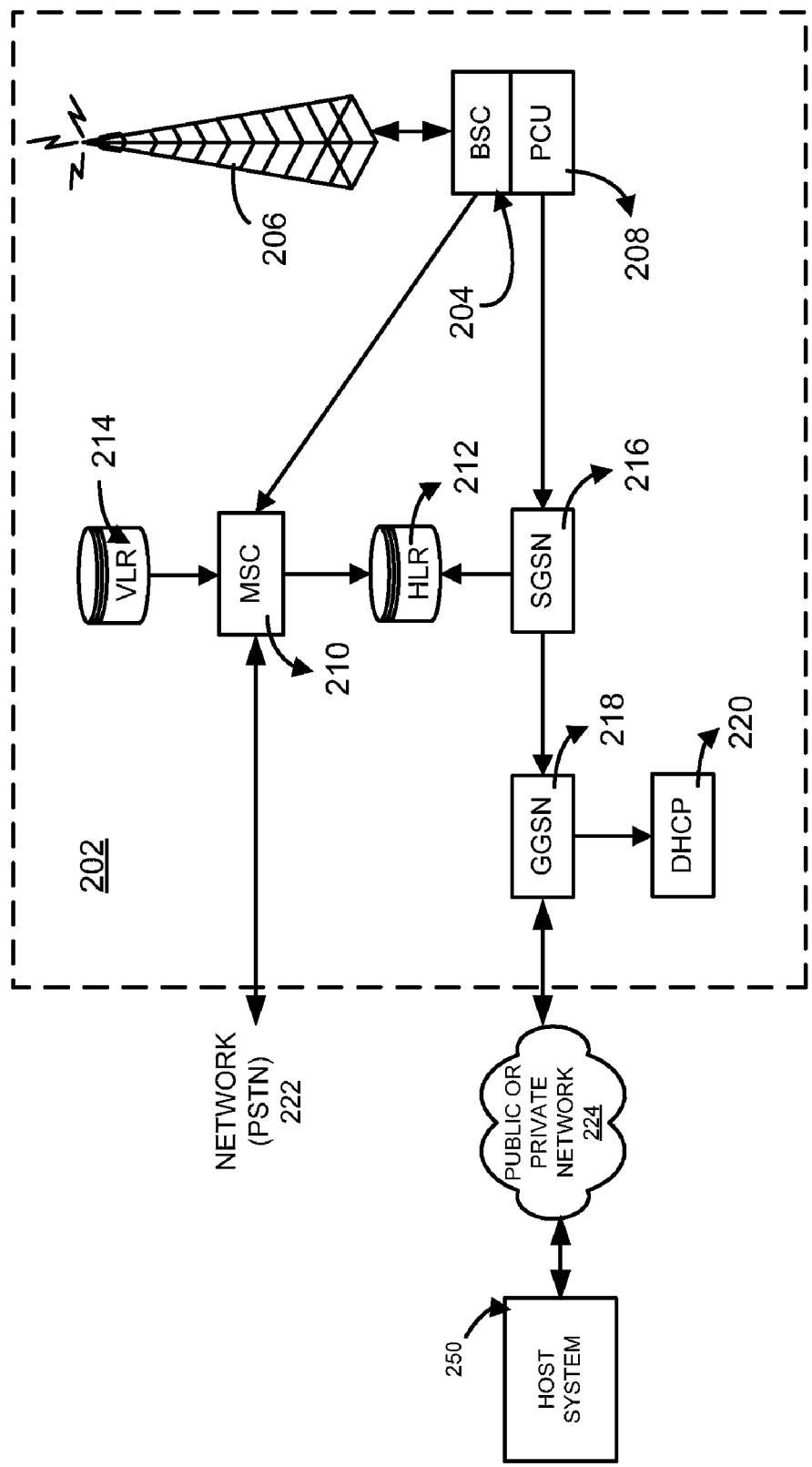
FIG. 3 is an exemplary block diagram of a node of a wireless network.

Referring now to FIG. 3, a block diagram of an exemplary implementation of a node 202 of the wireless network 200 is shown. In practice, the wireless network 200 comprises one or more nodes 202. In conjunction with the connect module 144, the mobile device 100 can communicate with the node 202 within the wireless network 200. In the exemplary implementation of FIG. 3, the node 202 is configured in accordance with General Packet Radio Service (GPRS) and Global Systems for Mobile (GSM) technologies. The node 202 includes a base station controller (BSC) 204 with an associated tower station 206, a Packet Control Unit (PCU) 208 added for GPRS support in GSM, a Mobile Switching Center (MSC) 210, a Home Location Register (HLR) 212, a Visitor Location Registry (VLR) 214, a Serving GPRS Support Node (SGSN) 216, a Gateway GPRS Support Node (GGSN) 218, and a Dynamic Host Configuration Protocol (DHCP) 220. This list of components is not meant to be an exhaustive list of the components of every node 202 within a GSM/GPRS network, but rather a list of components that are commonly used in communications through the network 200.

In a GSM network, the MSC 210 is coupled to the BSC 204 and to a landline network, such as a Public Switched Telephone Network (PSTN) 222 to satisfy circuit switched requirements. The connection through the PCU 208, the SGSN 216 and the GGSN 218 to a public or private network (Internet) 224 (also referred to herein generally as a shared network infrastructure) represents the data path for GPRS capable mobile devices. In a GSM network extended with GPRS capabilities, the BSC 204 also contains the Packet Control Unit (PCU) 208 that connects to the SGSN 216 to control segmentation, radio channel allocation and to satisfy packet switched requirements. To track the location of the mobile device 100 and availability for both circuit switched and packet switched management, the HLR 212 is shared between the MSC 210 and the SGSN 216. Access to the VLR 214 is controlled by the MSC 210.

The station 206 is a fixed transceiver station and together with the BSC 204 form fixed transceiver equipment. The fixed transceiver equipment provides wireless network coverage for a particular coverage area commonly referred to as a "cell". The fixed transceiver equipment transmits communication signals to and receives communication signals from mobile devices within its cell via the station 206. The fixed transceiver equipment normally performs such functions as modulation and possibly encoding and/or encryption of signals to be transmitted to the mobile device 100 in accordance with particular, usually predetermined, communication protocols and parameters, under control of its controller. The fixed transceiver equipment similarly demodulates and possibly decodes and decrypts, if necessary, any communication signals received from the mobile device 100 within its cell. Communication protocols and parameters may vary between different nodes. For example, one node may employ a different modulation scheme and operate at different frequencies than other nodes.

For all mobile devices 100 registered with a specific network, permanent configuration data such as a user profile is stored in the HLR 212. The HLR 212 also contains location information for each registered mobile device and can be queried to determine the current location of a mobile device. The MSC 210 is responsible for a group of location areas and stores the data of the mobile devices currently in its area of responsibility in the VLR 214. Further, the VLR 214 also contains information on mobile devices that are visiting other networks. The information in the VLR 214 includes part of the permanent mobile device data transmitted from the HLR 212 to the VLR 214 for faster access. By moving additional information from a remote HLR 212 node to the VLR 214, the amount of traffic between these nodes can be reduced so that voice and data services can be provided with faster response times and at the same time requiring less use of computing resources.

The SGSN 216 and the GGSN 218 are elements added for GPRS support; namely packet switched data support, within GSM. The SGSN 216 and the MSC 210 have similar responsibilities within the wireless network 200 by keeping track of the location of each mobile device 100. The SGSN 216 also performs security functions and access control for data traffic on the wireless network 200. The GGSN 218 provides inter-networking connections with external packet switched networks and connects to one or more SGSN's 216 via an Internet Protocol (IP) backbone network operated within the network 200. During normal operations, a given mobile device 100 must perform a "GPRS Attach" to acquire an IP address and to access data services. This requirement is not present in circuit switched voice channels as Integrated Services Digital Network (ISDN) addresses are used for routing incoming and outgoing calls. Currently, all GPRS capable networks use private, dynamically assigned IP addresses, thus requiring the DHCP server 220 connected to the GGSN 218. There are many mechanisms for dynamic IP assignment, including using a combination of a Remote Authentication Dial-In User Service (RADIUS) server and a DHCP server. Once the GPRS Attach is complete, a logical connection is established from a mobile device 100, through the PCU 208, and the SGSN 216 to an Access Point Node (APN) within the GGSN 218. The APN represents a logical end of an IP tunnel that can either access direct Internet compatible services or private network connections. The APN also represents a security mechanism for the network 200, insofar as each mobile device 100 must be assigned to one or more APNs and mobile devices 100 cannot exchange data without first performing a GPRS Attach to an APN that it has been authorized to use. The APN may be considered to be similar to an Internet domain name such as "myconnection.wireless.com".

Once the GPRS Attach operation is complete, a tunnel is created and all traffic is exchanged within standard IP packets using any protocol that can be supported in IP packets. This includes tunneling methods such as IP over IP as in the case with some IPSecurity (Ipsec) connections used with Virtual Private Networks (VPN). These tunnels are also referred to as Packet Data Protocol (PDP) Contexts and there are a limited number of these available in the network 200. To maximize use of the PDP Contexts, the network 200 will run an idle timer for each PDP Context to determine if there is a lack of activity. When a mobile device 100 is not using its PDP Context, the PDP Context can be de-allocated and the IP address returned to the IP address pool managed by the DHCP server 220.

Figure 4:
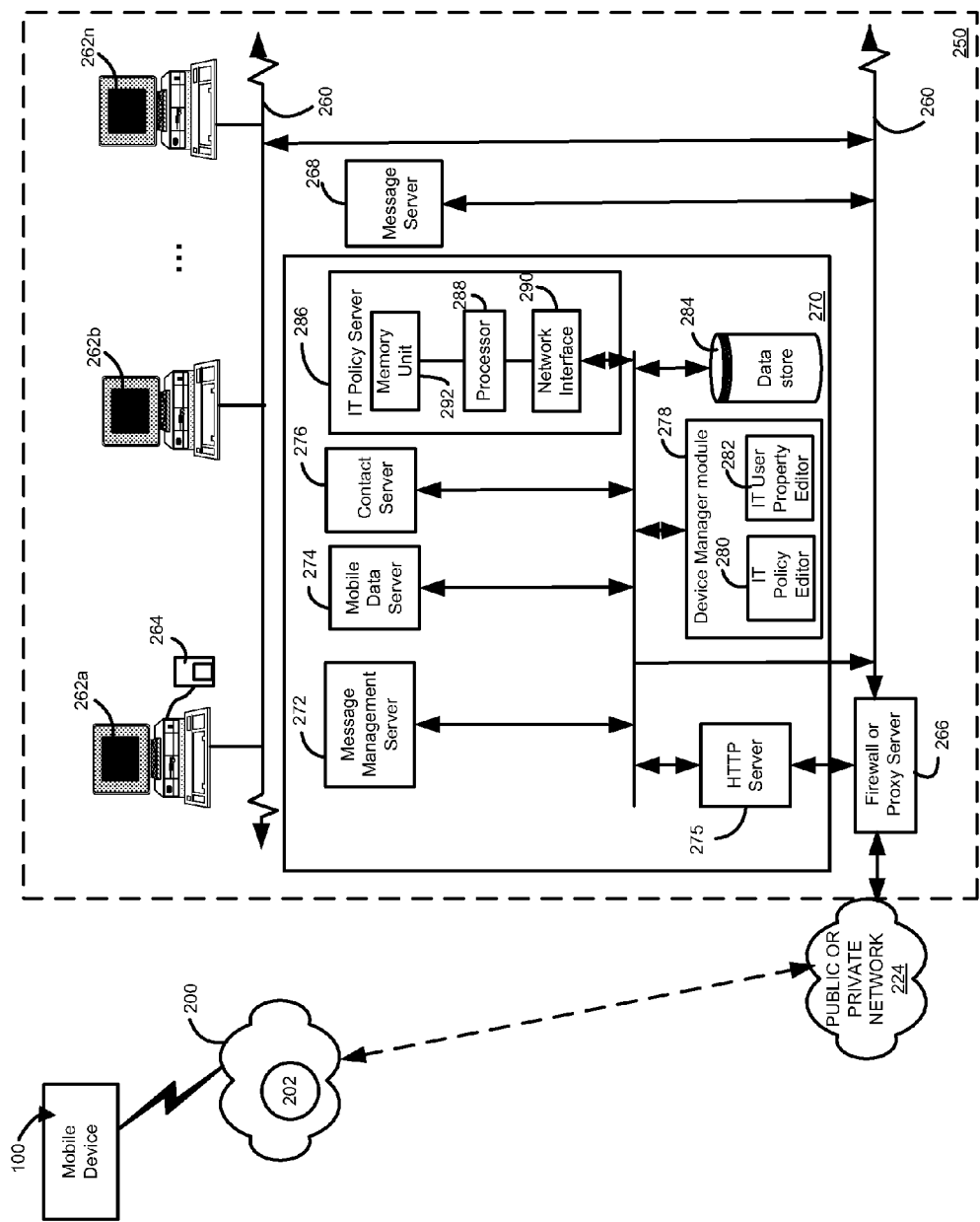
FIG. 4 is a block diagram illustrating components of a host system in one exemplary configuration for use with the wireless network of FIG. 3 and the mobile device of FIG. 1.

Referring now to FIG. 4, shown therein is a block diagram illustrating components of an exemplary configuration of a host system 250 that the mobile device 100 can communicate with in conjunction with the connect module 144. The host system 250 will typically be a corporate enterprise or other local area network (LAN), but may also be a home office computer or some other private system, for example, in variant implementations. In this example shown in FIG. 4, the host system 250 is depicted as a LAN of an organization to which a user of the mobile device 100 belongs. Typically, a plurality of mobile devices can communicate wirelessly with the host system 250 through one or more nodes 202 of the wireless network 200.

The host system 250 comprises a number of network components connected to each other by a network 260. For instance, a user's desktop computer 262a with an accompanying cradle 264 for the user's mobile device 100 is situated on a LAN connection. The cradle 264 for the mobile device 100 can be coupled to the computer 262a by a serial or a Universal Serial Bus (USB) connection, for example. Other user computers 262b-262n are also situated on the network 260, and each may or may not be equipped with an accompanying cradle 264. The cradle 264 facilitates the loading of information (e.g. PIM data, private symmetric encryption keys to facilitate secure communications) from the user computer 262a to the mobile device 100, and may be particularly useful for bulk information updates often performed in initializing the mobile device 100 for use. The information downloaded to the mobile device 100 may include certificates used in the exchange of messages.

It will be understood by persons skilled in the art that the user computers 262a-262n will typically also be connected to other peripheral devices, such as printers, etc. which are not explicitly shown in FIG. 4. Furthermore, only a subset of network components of the host system 250 are shown in FIG. 4 for ease of exposition, and it will be understood by persons skilled in the art that the host system 250 will comprise additional components that are not explicitly shown in FIG. 4 for this exemplary configuration. More generally, the host system 250 may represent a smaller part of a larger network (not shown) of the organization, and may comprise different components and/or be arranged in different topologies than that shown in the exemplary embodiment of FIG. 4.

To facilitate the operation of the mobile device 100 and the wireless communication of messages and message-related data between the mobile device 100 and components of the host system 250, a number of wireless communication support components 270 can be provided. In some implementations, the wireless communication support components 270 can include a message management server 272, a mobile data server (MDS) 274, a web server, such as Hypertext Transfer Protocol (HTTP) server 275, a contact server 276, and a device manager module 278. The device manager module 278 includes an IT Policy editor 280 and an IT user property editor 282, as well as other software components for allowing an IT administrator to configure the mobile devices 100. In an alternative embodiment, there may be one editor that provides the functionality of both the IT policy editor 280 and the IT user property editor 282. The support components 270 also include a data store 284, and an IT policy server 286. The IT policy server 286 includes a processor 288, a network interface 290 and a memory unit 292. The processor 288 controls the operation of the IT policy server 286 and executes functions related to the standardized IT policy as described below. The network interface 290 allows the IT policy server 286 to communicate with the various components of the host system 250 and the mobile devices 100. The memory unit 292 can store functions used in implementing the IT policy as well as related data. Those skilled in the art know how to implement these various components. Other components may also be included as is well known to those skilled in the art. Further, in some implementations, the data store 284 can be part of any one of the servers.

In this exemplary embodiment, the mobile device 100 communicates with the host system 250 through node 202 of the wireless network 200 and a shared network infrastructure 224 such as a service provider network or the public Internet. Access to the host system 250 may be provided through one or more routers (not shown), and computing devices of the host system 250 may operate from behind a firewall or proxy server 266. The proxy server 266 provides a secure node and a wireless internet gateway for the host system 250. The proxy server 266 intelligently routes data to the correct destination server within the host system 250.

In some implementations, the host system 250 can include a wireless VPN router (not shown) to facilitate data exchange between the host system 250 and the mobile device 100. The wireless VPN router allows a VPN connection to be established directly through a specific wireless network to the mobile device 100. The wireless VPN router can be used with the Internet Protocol (IP) Version 6 (IPV6) and IP-based wireless networks. This protocol can provide enough IP addresses so that each mobile device has a dedicated IP address, making it possible to push information to a mobile device at any time. An advantage of using a wireless VPN router is that it can be an off-the-shelf VPN component, and does not require a separate wireless gateway and separate wireless infrastructure. A VPN connection can preferably be a Transmission Control Protocol (TCP)/IP or User Datagram Protocol (UDP)/IP connection for delivering the messages directly to the mobile device 100 in this alternative implementation.

Messages intended for a user of the mobile device 100 are initially received by a message server 268 of the host system 250. Such messages may originate from any number of sources. For instance, a message may have been sent by a sender from the computer 262b within the host system 250, from a different mobile device (not shown) connected to the wireless network 200 or a different wireless network, or from a different computing device, or other device capable of sending messages, via the shared network infrastructure 224, possibly through an application service provider (ASP) or Internet service provider (ISP), for example.

The message server 268 typically acts as the primary interface for the exchange of messages, particularly e-mail messages, within the organization and over the shared network infrastructure 224. Each user in the organization that has been set up to send and receive messages is typically associated with a user account managed by the message server 268. Some exemplary implementations of the message server 268 include a Microsoft Exchange™ server, a Lotus Domino™ server, a Novell Groupwise™ server, or another suitable mail server installed in a corporate environment. In some implementations, the host system 250 may comprise multiple message servers 268. The message server 268 may also be adapted to provide additional functions beyond message management, including the management of data associated with calendars and task lists, for example.

When messages are received by the message server 268, they are typically stored in a data store associated with the message server 268. In at least some embodiments, the data store may be a separate hardware unit, such as data store 284, that the message server 268 communicates with. Messages can be subsequently retrieved and delivered to users by accessing the message server 268. For instance, an e-mail client application operating on a user's computer 262a may request the e-mail messages associated with that user's account stored on the data store associated with the message server 268. These messages are then retrieved from the data store and stored locally on the computer 262a. The data store associated with the message server 268 can store copies of each message that is locally stored on the mobile device 100. Alternatively, the data store associated with the message server 268 can store all of the messages for the user of the mobile device 100 and only a smaller number of messages can be stored on the mobile device 100 to conserve memory. For instance, the most recent messages (i.e. those received in the past two to three months for example) can be stored on the mobile device 100.

When operating the mobile device 100, the user may wish to have e-mail messages retrieved for delivery to the mobile device 100. The message application 138 operating on the mobile device 100 may also request messages associated with the user's account from the message server 268. The message application 138 may be configured (either by the user or by an administrator, possibly in accordance with an organization's IT policy) to make this request at the direction of the user, at some pre-defined time interval, or upon the occurrence of some pre-defined event. In some implementations, the mobile device 100 is assigned its own e-mail address, and messages addressed specifically to the mobile device 100 are automatically redirected to the mobile device 100 as they are received by the message server 268.

The message management server 272 can be used to specifically provide support for the management of messages, such as e-mail messages, that are to be handled by mobile devices. Generally, while messages are still stored on the message server 268, the message management server 272 can be used to control when, if, and how messages are sent to the mobile device 100. The message management server 272 also facilitates the handling of messages composed on the mobile device 100, which are sent to the message server 268 for subsequent delivery.

For example, the message management server 272 may monitor the user's "mailbox" (e.g. the message store associated with the user's account on the message server 268) for new e-mail messages, and apply user-definable filters to new messages to determine if and how the messages are relayed to the user's mobile device 100. The message management server 272 may also, through an encoder 273, compress messages, using any suitable compression technology (e.g. YK compression, and other known techniques) and encrypt messages (e.g. using an encryption technique such as Data Encryption Standard (DES), Triple DES, or Advanced Encryption Standard (AES)), and push them to the mobile device 100 via the shared network infrastructure 224 and the wireless network 200. The message management server 272 may also receive messages composed on the mobile device 100 (e.g. encrypted using Triple DES), decrypt and decompress the composed messages, re-format the composed messages if desired so that they will appear to have originated from the user's computer 262a, and re-route the composed messages to the message server 268 for delivery.

Certain properties or restrictions associated with messages that are to be sent from and/or received by the mobile device 100 can be defined (e.g. by an administrator in accordance with IT policy) and enforced by the message management server 272. These may include whether the mobile device 100 may receive encrypted and/or signed messages, minimum encryption key sizes, whether outgoing messages must be encrypted and/or signed, and whether copies of all secure messages sent from the mobile device 100 are to be sent to a pre-defined copy address, for example.

The message management server 272 may also be adapted to provide other control functions, such as only pushing certain message information or pre-defined portions (e.g. "blocks") of a message stored on the message server 268 to the mobile device 100. For example, in some cases, when a message is initially retrieved by the mobile device 100 from the message server 268, the message management server 272 may push only the first part of a message to the mobile device 100, with the part being of a pre-defined size (e.g. 2 KB). The user can then request that more of the message be delivered in similar-sized blocks by the message management server 272 to the mobile device 100, possibly up to a maximum pre-defined message size. Accordingly, the message management server 272 facilitates better control over the type of data and the amount of data that is communicated to the mobile device 100, and can help to minimize potential waste of bandwidth or other resources.

The MDS 274 encompasses any other server that stores information that is relevant to the corporation. The mobile data server 274 may include, but is not limited to, databases, online data document repositories, customer relationship management (CRM) systems, or enterprise resource planning (ERP) applications. The MDS 274 can also connect to the Internet or other public network, through HTTP server 275 or other suitable web server such as an File Transfer Protocol (FTP) server, to retrieve HTTP webpages and other data. Requests for webpages are typically routed through MDS 274 and then to HTTP server 275, through suitable firewalls and other protective mechanisms. The web server then retrieves the webpage over the Internet, and returns it to MDS 274. As described above in relation to message management server 272, MDS 274 is typically provided, or associated, with an encoder 277 that permits retrieved data, such as retrieved webpages, to be compressed, using any suitable compression technology (e.g. YK compression, and other known techniques), and encrypted (e.g. using an encryption technique such as DES, Triple DES, or AES), and then pushed to the mobile device 100 via the shared network infrastructure 224 and the wireless network 200.

The contact server 276 can provide information for a list of contacts for the user in a similar fashion as the address book on the mobile device 100. Accordingly, for a given contact, the contact server 276 can include the name, phone number, work address and e-mail address of the contact, among other information. The contact server 276 can also provide a global address list that contains the contact information for all of the contacts associated with the host system 250.

It will be understood by persons skilled in the art that the message management server 272, the MDS 274, the HTTP server 275, the contact server 276, the device manager module 278, the data store 284 and the IT policy server 286 do not need to be implemented on separate physical servers within the host system 250. For example, some or all of the functions associated with the message management server 272 may be integrated with the message server 268, or some other server in the host system 250. Alternatively, the host system 250 may comprise multiple message management servers 272, particularly in variant implementations where a large number of mobile devices need to be supported.

The device manager module 278 provides an IT administrator with a graphical user interface with which the IT administrator interacts to configure various settings for the mobile devices 100. As mentioned, the IT administrator can use IT policy rules to define behaviors of certain applications on the mobile device 100 that are permitted such as phone, web browser or Instant Messenger use. The IT policy rules can also be used to set specific values for configuration settings that an organization requires on the mobile devices 100 such as auto signature text, WLAN/VoIP/VPN configuration, security requirements (e.g. encryption algorithms, password rules, etc.), specifying themes or applications that are allowed to run on the mobile device 100, and the like.

According to one aspect, we provide a method and system for grouping contexts from a given context model together to create a new context model that has fewer contexts, but retains acceptable compression gains compared to the context model with more contexts.

According to an exemplary embodiment consistent with this aspect, a set of files that are correlated to the file to be compressed (hereafter called training files) are read to determine, for an initial context model, the empirical statistics of contexts and symbols. In some embodiments, this includes determining the estimated joint and conditional probabilities of the various contexts and symbols (or blocks of symbols). Examples of an initial context model include, but are not limited to, the previous/symbols, any combination of the previous/symbols, any combination of bits from the previous/symbols, or the context model derived from a previous iteration of this method and system.

The initial context model is then reduced to a desired number of contexts, for example, by applying a grouping function g to the original set of contexts to obtain a new and smaller set of contexts.

For example, consider a data sequence $x_1, x_2, \ldots, x_m$ (consisting of one training file or a concatenation of several training files) along with its respective context sequence $c_1, c_2, \ldots c_m$ generated from the initial context model. Determine their corresponding $n^{th}$ order empirical statistics which, say, are represented by the joint probability distribution $P(X_1, X_2, \ldots, X_n, C_1, C_2, \ldots, C_n)$ of random symbols $X_1, X_2, \ldots, X_n$ and their corresponding contexts $C_1, C_2, \ldots C_n$. If the initial context model satisfies that the next context is determined by the current context and current symbol, in other words, there is a function f such that the next context $c_{i+1}$ is $C_{i+1}=f(x_i,c_i)$ for $i=1, 2, \ldots m$, then one can apply CBYK along with the initial context model to compress the data sequence The resulting CBYK compression rate, when the total length m is large enough, is given as $$r<=H(X_1, \ldots, X_n|C_1)/(n)+o(\log(m)/m)$$

where $H(X_1, \ldots, X_n|C_1)$ is the conditional entropy of $X_1, \ldots, X_n$ given $C_1$. To reduce the memory requirements, a grouping function g is applied to the original set of contexts $\{c^1, c^2, \ldots, c^j\}$ to obtain a new and smaller set of contexts $\{\hat{c}^1, \hat{c}^2, \ldots, \hat{c}^k\}$. Accordingly, we want to choose a mapping function g:

$$g: \epsilon=\{c^1,c^2,\ldots,c^j\} \to \hat{\epsilon}=\{\hat{c}^1,\hat{c}^2,\ldots,\hat{c}^k\} \text{ wherein } k<j.$$

Embodiments of the invention relate to choosing a mapping function g which satisfies:

$$g(f(x,c))=g(f(x,c')) \text{ whenever } g(c)=g(c') \qquad (1)$$

for any symbol x and any $c,c' \epsilon \{c^1, c^2, \ldots, c^j\}$, and keeps the processing requirements and the compression rate r for CBYK within acceptable limits, wherein $$r<=H(X_1, \ldots, X_n|g(C_1))/(n)+o(\log(m)/m)$$

One method of finding a grouping g with the above property such that r is minimized is to find a g such that $H(X_1, \ldots, X_n|g(C_1))$ is minimized among all group functions with the above property. According to one embodiment, this is done by grouping contexts together on an iterative basis, and finding a local minimum for each iteration.

In some embodiments, an iterative procedure is executed to incrementally reduce the number of contexts to the desired number of contexts. A context model including a reduced set of contexts is then used by both a compression encoder to compress the file, and by a corresponding decoder to decompress the file. For example, referring back to FIG. 4, an encoder can be located at one or all of the servers such as mobile data server 274, or message management server 272, and the corresponding decoder on mobile device 100, thus facilitating the transmission of data between various servers and the mobile device 100. Similarly an encoder can be present at the mobile device 100 and a corresponding decoder at one or all of the servers with which the mobile device communicates. It should be noted that the encoder and decoder can be co-located (for example, if compression is used to reduce storage space) or can be located in separate devices (if compression is used for transmission purposes).

To incrementally reduce the number of contexts to the desired number of contexts, a statistical analysis is performed on a large number of training files. "Large number" preferably implies a sufficient number of files that adding one additional file does not significantly change the empirical statistics. In one exemplary embodiment a thousand training files was used. In some embodiments the joint and conditional probabilities are calculated. As different categories of data files may have different structures and different recurrences of contexts, embodiments of the invention will use different categories of training files dependent on a file categorization criteria of the data file to be compressed. File categorization criteria can include file type, content type, language, and file structure. Note that each category of data file (for example, web page, email, word document, spreadsheet, executable, picture, multi-media file, blog, portal, etc.) will all have the same initial context model including the original set of contexts—for example the initial context model may use the previous single byte as the context for the current symbol. However, the different categories of training files may have different probabilities, which would in turn result in a different set of reduced contexts in the end. Accordingly, assigning an initial context length, which is typically set equal to a predetermined number of bits (or bytes), depends on the file categorization criteria.

According to one embodiment, such a context model is developed in advance of, and then subsequently used by, a compression algorithm which uses the context model to compress a data file. For example, a mapping file M which represents a mapping from all original contexts to the reduced context set corresponding to the grouping function g is determined in advance, and used by both a CBYK encoder and the corresponding CBYK decoder.

According to one embodiment, the mapping file M which represents the grouping function g is determined in advance, and used by both a CBYK encoder and the corresponding CBYK decoder. For example, assume that a CBYK encoder is located at a server A storing Data file X, and the corresponding CBYK decoder is located at terminal B which requires Data file X. To facilitate transmission of X from A to B, X is compressed by the CBYK encoder at A, and then decompressed by the CBYK decoder at B. However, neither the CBYK encoder at A, nor the CBYK decoder at B need to execute the algorithm to determine the context model. Instead, according to an embodiment of the invention, the context model is determined in advance and stored at both A and B. Thus, A and B only need to implement the CBYK compression algorithm itself, based on said context model.

Alternatively, rather than creating such a context model in advance, given sufficient processing power, the context model can be continuously updated at both A and B to provide a more reliable and up-to-date context model. Another alternative is the continuous update of the context model at A. This can be implemented at A and transmitted to B, prior to the transmission of the compressed data. Yet another alternative is to periodically update the model at A, for example after some number of messages, and then transmitting the updated context model from A to B. While the new context model is being generated, the previous context model is used, and the updated context model is not used until it has been transmitted to B, for example in a separate message.

Figure 5:
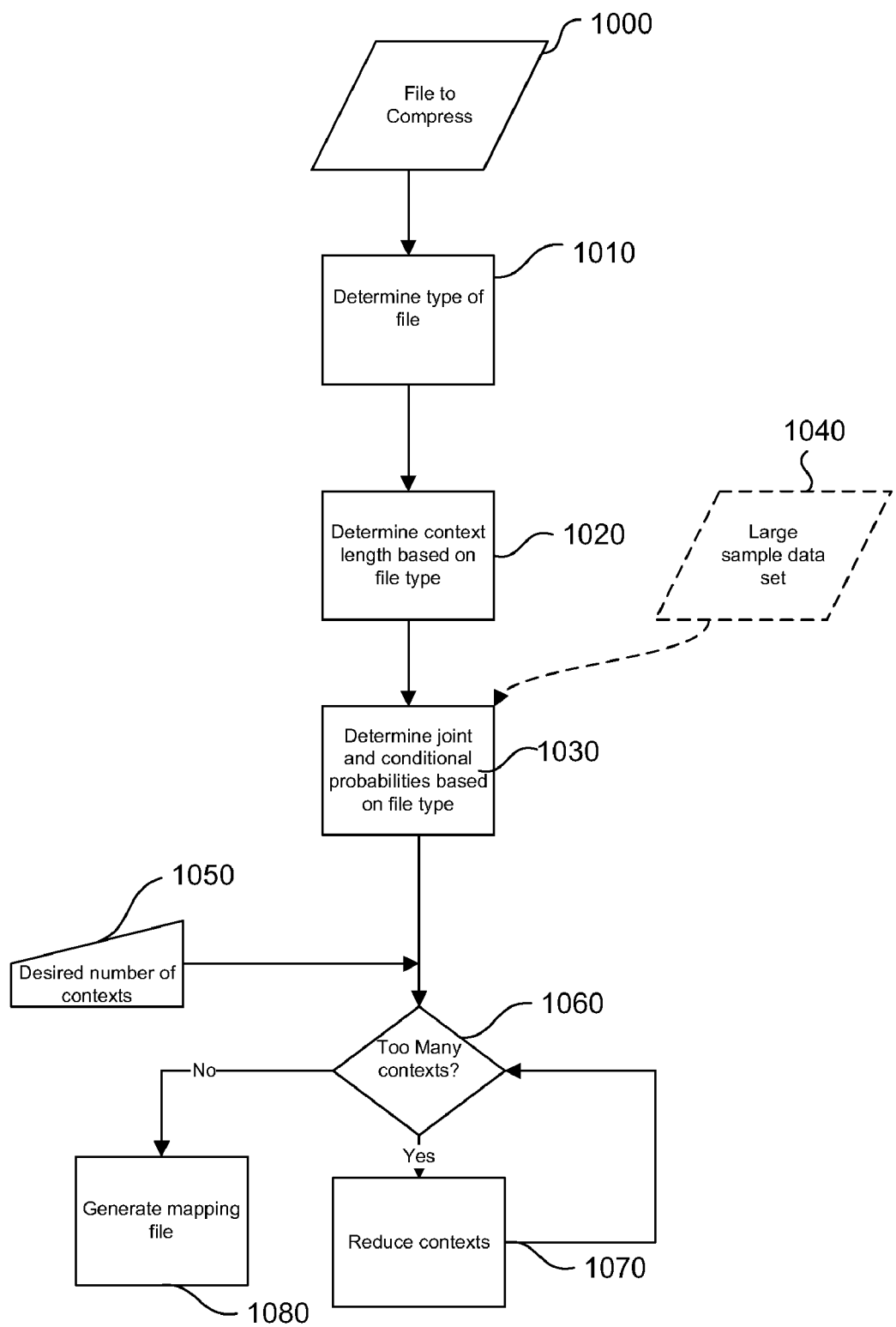
FIG. 5 is a flow chart illustrating method steps according to one embodiment.

FIG. 5 is a flow chart illustrating method steps according to one embodiment. In this embodiment the process takes into account the fact that the joint and conditional probabilities can depend on the category of file to be compressed, as discussed above.

Accordingly, once the system receives a file to compress 1000, it first attempts to determine the category of file 1010. The system then uses the category of file to determine an initial context set. This initial context set has a context length/1020, which defines an initial number of contexts to be used based on the category of file. The system then sets the value of a variable representing the current number of contexts to the initial number of contexts.

Similarly, the system will then determine the joint and conditional probabilities for the different initial contexts and symbols (or blocks of symbols) based on the file type 1030. Note that the joint and conditional probabilities can be determined, for example, by gathering empirical statistics for that data type from a set of training files 1040 which represents a large sample data set from a number of files of that category. In some embodiments, only the second order empirical statistics are used in order to reduce memory requirements. However, the system and methods are not limited to the second order, and one can also collect and apply the $n^{th}$ order empirical statistics where n is a prescribed parameter.

A desired number of contexts is then assigned 1050. Note the desired number of contexts is a parameter supplied based on memory requirements. Generally, this number represents a tradeoff between the amount of memory required for the compression and/or decompression process and the amount of compression (i.e. the more memory that is available for use, the greater the amount of compression—within limits). The system determines whether the current number of contexts exceeds the desired number of contexts 1060. If so, the system reduces the contexts 1070 until the number of contexts equals the desired number of contexts. The system then generates a mapping file 1080 representing the reduced context set.

Note other determinations can optionally be made based on the category of file, for example which "order" (in the sense of first, second, . . . , or $n^{th}$ order) statistics/entropy are used, based on the prescribed parameter.

According to some embodiments of the invention, the context length and desired number of contexts can be selected based on the type of device used—either at the compression or decompression stage. In typical transmission situations, the transmitting device compresses the data file prior to transmission and the receiving device decompresses the received file. The limiting factor often depends on the device with the lowest capacity. For example, a handheld mobile communications device is likely to have less capacity (e.g. memory and processing power) than a desktop computer. In addition, we note that the compression process and the decompression may have different capacity requirements, as the CBYK encoder requires more memory. Thus, the context length and desired number of contexts will be selected to be smaller for a mobile device transmitting a file (e.g. if it is used as a modem) than if both the transmitter and receiver are high-end computers.

These factors may also of course depend on the alphabet or language used in text or text based application files. For example, English using ASCII encoding will only require a single byte to represent every character in the alphabet, whereas other languages with a larger alphabet may require two bytes to represent every character. Accordingly, a single byte may be an appropriate context length for one language, whereas two bytes may be more appropriate for others. Accordingly in some embodiments, determining an initial context model includes determining the size of the alphabet used based on the determined file categorization criteria and then assigning an initial context length equal to a number bits (which may be in form of bytes) based on the number of bits needed to encode all elements of said alphabet and wherein the initial context set is derived based on this context length.

In some embodiments, each category of data file will have a different context length and a different set of training files, and therefore a different set of joint and conditional probabilities.

Figure 6:
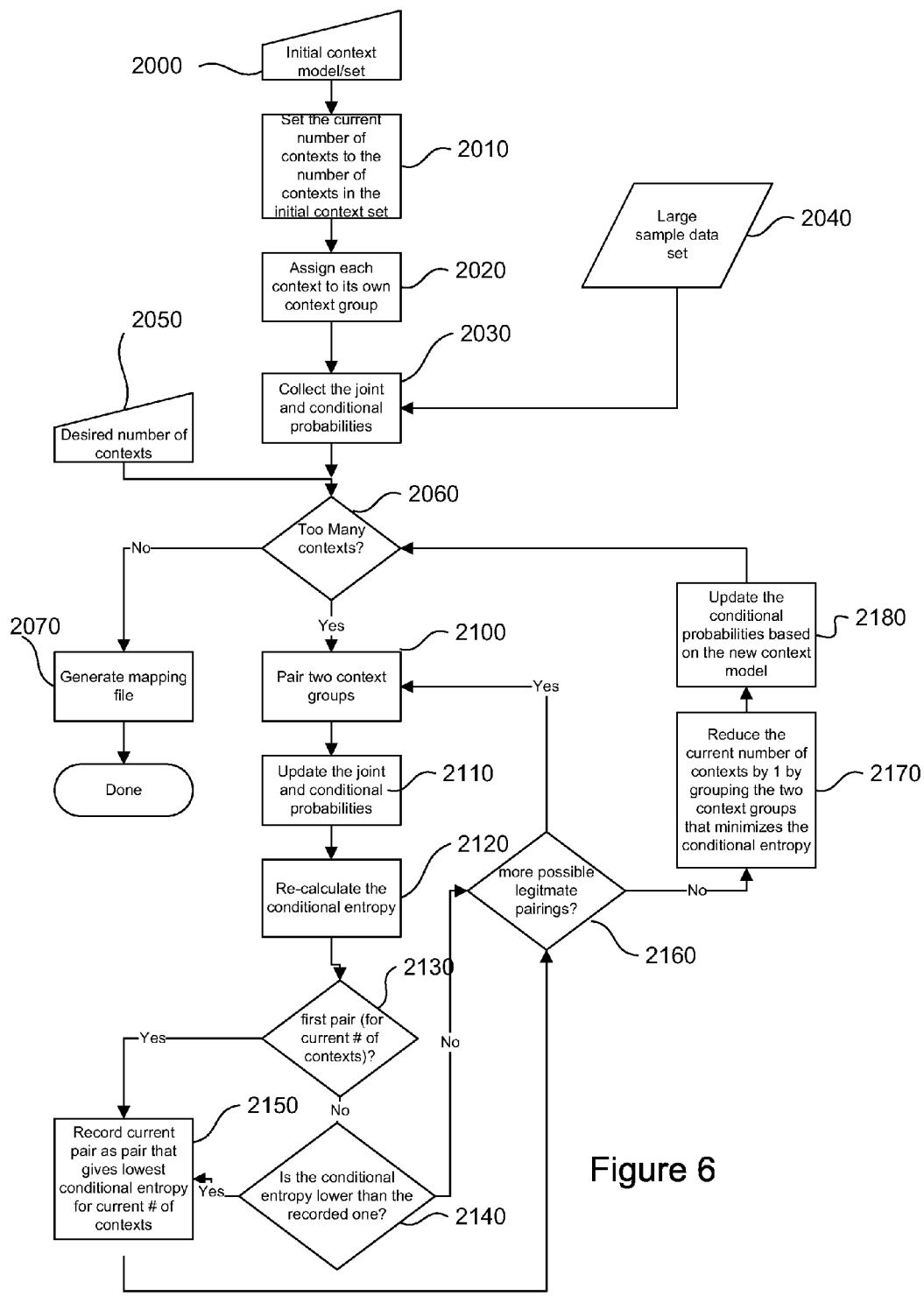
FIG. 6 is a flow chart illustrating method steps according to another embodiment.

FIG. 6 is a flow chart illustrating method steps according to another embodiment. In particular, FIG. 6 illustrates one implementation for reducing the context set. FIG. 6 illustrates an initialization procedure which generates an initial context model and assigns various parameters in steps 2000 to 2040. Steps 2100 through 2180 illustrate an example of reducing the initial context model to a desired number of contexts (which is defined in 2050). In this example, an iterative procedure is implemented to combine legitimate groups of contexts together until the current number of contexts equals the desired number of contexts 2060. Two groups of contexts are said to be legitimate if, when they are combined, certain properties—for example, the property expressed in Equation (1) in some embodiments—are maintained.

The first step in the initialization procedure involves establishing an initial context model comprising all of the elements of a context set 2000. As the initial context model can depend on the file type, some embodiments generate an initial context model for each file type. Alternatively, a default context model is derived for all file types. As part of initialization procedure, a variable defining the current number of contexts is set to the number of contexts in the initial context set 2010. Then, each context within the context set is assigned to a context group 2020 (such that each group initially includes a single context). The joint and the conditional probabilities for the different contexts and symbols (or blocks of symbols) are then collected, for example from a large sample data set 2040. As discussed herein, a desired number of contexts based on memory requirements is set. It should be appreciated that a default context set with a default initial number of contexts and a default desired number of contexts may be set and used in all applications. However, as discussed herein, these values may be preferentially assigned based on the file type and the desired memory requirements.

If there are too many contexts 2060, that is to say, the current number of contexts exceeds the desired number of contexts, the method reduces the number of contexts by applying a grouping function to the set of contexts to combine the contexts into a smaller set of contexts. Note that a smaller set of contexts refers to a smaller number of contexts.

In the embodiment shown in FIG. 6, a particular grouping function is illustrated which for each current number of contexts chooses two legitimate groups to combine based on a local minimization scheme. This is repeated iteratively, with each iteration attempting to reduce the current number of contexts, until the desired number of contexts is reached. For each iteration, the process starts by creating a temporary context model which is obtained by pairing two legitimate context groups to form a single context group 2100. The process then updates the joint and conditional probabilities 2110 and recalculates the conditional entropy of the set. If this is the first pairing of two legitimate context groups 2130 (for the current number of contexts), then the current pairing of two legitimate context groups is recorded as the pair that gives the lowest conditional entropy 2150 (for the current number contexts). Otherwise, the process determines whether the conditional entropy associated with the current pairing is lower than the recorded value 2140. If it is lower, then the pair is recorded as being the pair of contexts that gives the lowest conditional entropy 2150. Then, the temporary context model is removed. This process is continued until there are no more legitimate pairings for the current number of contexts 2160. In other words, once all legitimate pairings for the current number of contexts have been evaluated, then the routine progresses to step 2170.

The process then reduces the current number of contexts by one, by grouping the two legitimate context groups that were recorded as being the pair of contexts that gave the lowest conditional entropy for the current number of contexts 2170. In other words, the method replaces each group of the recorded pair with a single group which comprises its constitute elements. Thus, the number of contexts is reduced. This step is repeated until the current number of contexts equals the desired number of contexts 2060.

Once the desired number of contexts is reached, the process generates a mapping file 2070, which we will refer to as M, which comprises the current set of context groupings.

At this point we should clarify that although each iteration of the grouping function determines which legitimate pairs of context groups should be combined. There is no restriction that each context group itself be limited to only two of the original contexts of the initial context set. In other words during any given iteration, two groups which has already been paired may be subsequently paired again while single elements may remain in the final context set. This can occur for example when there are many different possibilities for one particular context, whereas several other contexts can be combined and still act as a good predictor of the next parsed symbol or phrase. As a very simple example of this based on an English language alphabet, pairing the punctuation marks '?' and '.' together to form a single context group can act as a good predictor of the next symbol because the conditional probabilities of the following character will not have changed significantly between the new context group and the individual contexts '?' and '.'.

In the specific case of embodiments used with CBYK, it is preferable for the reduced context model to satisfy a transfer function which ensures certain performance properties of the CBYK algorithm in all cases. In this specific example, let C be an arbitrary (finite or infinite) set of contexts. In a general context model, for any sequence $x=x_1x_2 \ldots x_m$ drawn from an alphabet A, there is a context sequence $c_1c_2 \ldots c_m$ derived from C. In this context sequence, each $c_i$ can be determined from $x_1x_2 \ldots x_{i-1}$ and $c_1$ in some manner. For context models called state machine context models, the transfer function can be written as $$c_{i+1}=f(x_i,c_i), i=1,2,\ldots$$

where $c_1 \in C$ is an initial context and assumed to be fixed, and f is a mapping which will be referred to as a next context function.

If the reduced context set creates a situation where the next context cannot be derived from the current context and the current parsed phrase, then the related performance properties of CBYK are no longer necessarily true for all sources. Accordingly, this transfer function imposes an additional restriction, i.e., Equation (1), on the grouping function from which the resulting context model is derived, in some embodiments.

Accordingly, the mapping file preferably only includes context groups which satisfy this transfer function. This can be implemented in several ways.

One way to satisfy this requirement is to start with an initial context set that will always satisfy the transfer function (even when it is reduced). One example where this is true is when the last byte is used as the initial context model. Accordingly, some embodiments utilize the last byte as the initial context model. This simplifies processing, as it removes the necessity to check whether the transfer function is satisfied. Also, for cases which are constrained by memory requirements, using the last byte as the initial context model uses less memory than context models with longer context lengths.

Alternatively, one can satisfy the transfer function requirement by only grouping contexts together which satisfy such a function. For example, one embodiment starts with an initial context set that satisfies the transfer function requirement and ignores pairings that will violate the transfer function.

As another alternative, another embodiment can start with any initial context set. Then after the initial set is reduced such that the desired number of contexts is satisfied, the set is evaluated to determine whether the transfer function requirement is satisfied. If not, the system continues reducing it until the transfer function requirement is satisfied.

According to one embodiment, the previous byte is used as the initial context model for a compression algorithm. As a byte consists of 8 bits, there are 256 possible values ($2^8$). Thus, the initial number of contexts is 256. So $\{0, 1, \ldots, 255\}$ represents the complete set of initial contexts for a compression algorithm, which uses the previous byte as the initial context model. Let us assume that the memory requirements of a particular device make it desirable to reduce this number of contexts—for example to 64 contexts. According to an exemplary embodiment we produce a grouping function g which maps the original set of contexts (from 0 to 255) to a new set of contexts using the notation:

$$g: \{0,1,\ldots,255\} \to \hat{\epsilon} = \{\hat{c}^1, \hat{c}^2, \ldots, \hat{c}^{64}\}$$

The function g satisfies Equation (1), and the next reduced context $\hat{c}_{i+1}$ can be determined from the current reduced context $\hat{c}_i$ and the current symbol $x_i$ after $x_i$ is parsed.

We will now discuss a couple of methods of determining the next reduced context.

One method is to simply use a two dimensional array. For the above example, each current symbol $x_i$ takes values from $\{0, 1, 2, \ldots 255\}$, and each current reduced context $\hat{c}_i$ takes values from $\hat{\epsilon}$. Accordingly, one can simply use a 64*256 array to find the next reduced context, with each element of the array giving the next reduced context to use in response to the current reduced context $\hat{c}_i$ and the current symbol $x_i$.

Another embodiment utilizes the mapping function g not only to group the contexts into a reduced set of contexts to be used in CBYK, but is also used to determine the next reduced context $\hat{c}_{i+1} = g(c_{i+1})$, wherein ($c_{i+1}$) can be determined after $x_i$ is parsed. For the above specific example, doing this means the system only needs a one dimensional array of size 256, with each element of the array giving the next reduced context in response to any possible value $c_{i+1} \in \{0, 1, \ldots, 255\}$, rather than an array of size 64*256.

Figure 7:
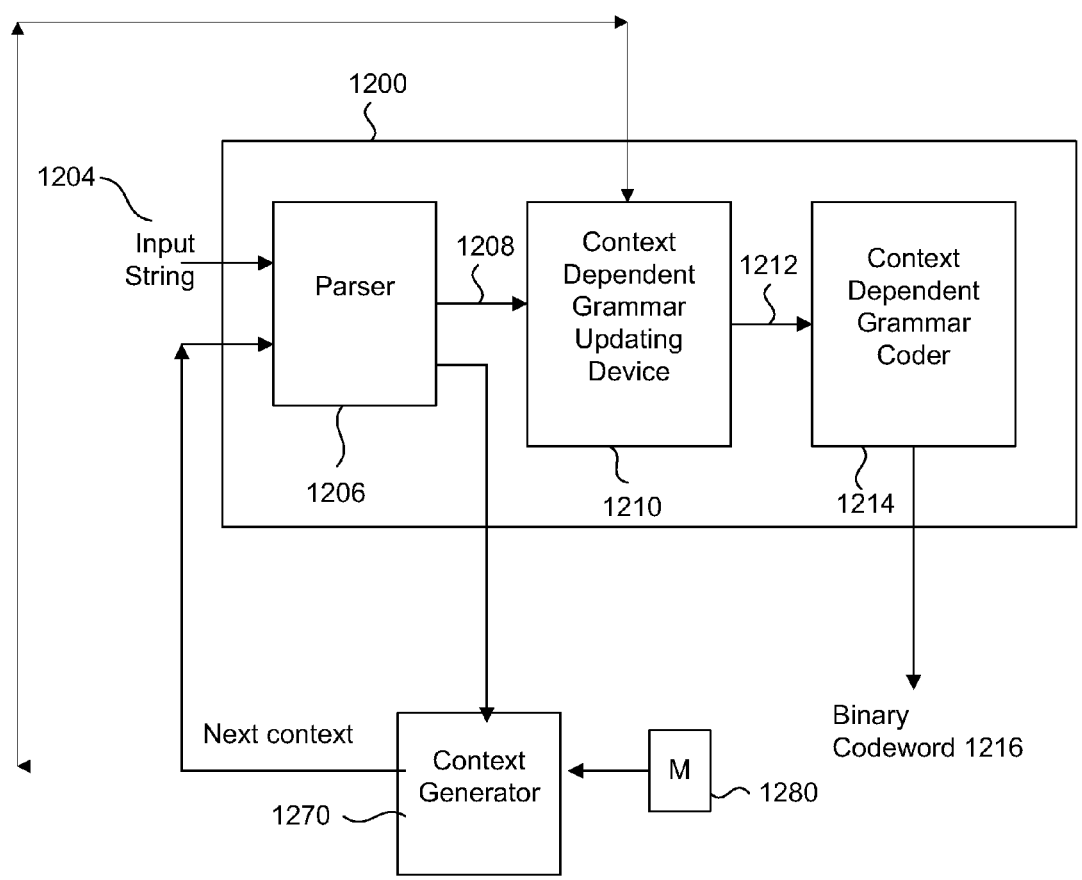
FIG. 7 is a block diagram which illustrates an apparatus for performing CBYK compression using a reduced context set, according to one embodiment.

FIG. 7 is a block diagram which illustrates an apparatus for performing CBYK compression using a reduced context set, according to one embodiment. The apparatus 1200 consists of a parser 1206, a context-dependent grammar updating device, 1210, a context-dependent grammar coder, 1214 and a Context Generator 1270. The parser 1206 accepts as input an input string 1204 and a context generated by the context generator 1270, and parses the input string 1204 into a series of non-overlapping substrings, 1208. The parser causes the transmission of the substrings 1208 to the context-dependent grammar updating device 1210, which accepts the received substrings 1208 and the context from the context generator 1270 as input and in turn produces an updated context-dependent grammar G. The context-dependent grammar updating device 1210 transmits the updated grammar G to the context-dependent grammar coder 1214 which then encodes the grammar G into a compressed binary codeword 1216.

Meanwhile, one output from the parser 1206 is sent to the context generator 1270, which uses the last parsed phrase and the context of the last parsed phrase, in conjunction with the mapping file M 1280 (which for example is generated by the methods described herein), to produce the current context, which is used for parsing the current phrase of the input string and for updating the context-dependent grammar G. For example, a suffix search is first performed on the current parsed phrase and the current context to find a representative context in the original unreduced context set and then the mapping file M 1280 is applied to the representative context to get a context in the reduced context set, which is the context for the next parsed phrase, which is then sent to both the parser 1206 and the Context-dependent grammar updating device 1210.

Figure 8:
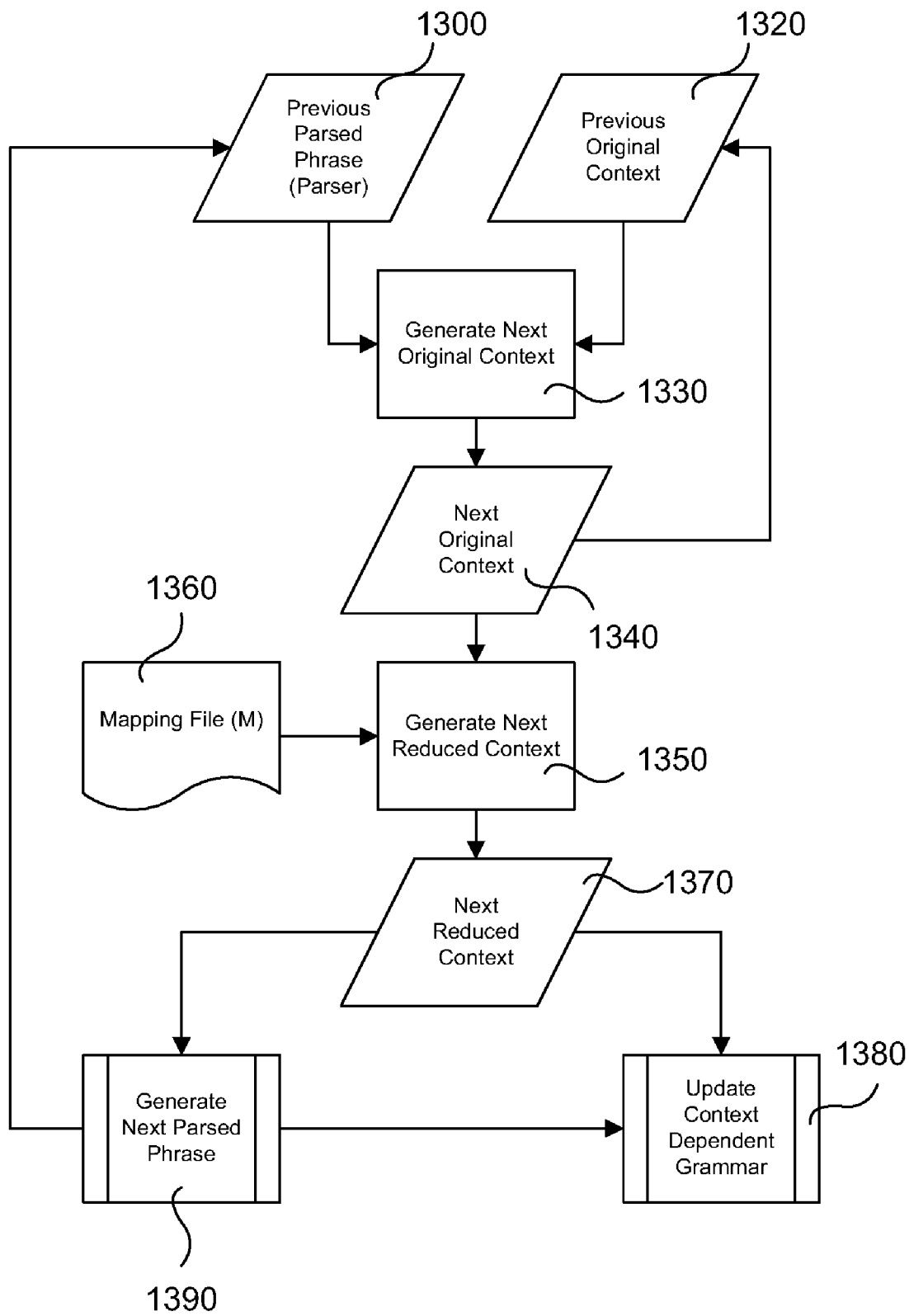
FIG. 8 is a flowchart illustrating how to determine the reduced context to be used in each iteration of a CBYK compression, according to an embodiment of the invention.

FIG. 8 illustrates a method of generating contexts from a reduced context set for CBYK compression. Such a method determines the next original context 1330 from the previous parsed phrase 1300, for example the output from Parser 1206 in FIG. 7, and from the previous original context 1320. The output from this stage is the next original context 1340, which becomes the previous original context 1320 in the next iteration. The next original context 1340 is then used to generate the next reduced context 1350 according to the mapping file (M) 1360, based on the g function. The next reduced context 1370 is then sent as an input to both the parser 1206 and the context dependent grammar updating device 1210 in FIG. 7. The parser then generates the next parsed phrase 1390, which is then used, along with the next reduced context to update the context dependent grammar 1380. The next parsed phrase is also sent to the context generator 1270 as the previous parsed phrase 1300 for the next iteration.

The apparatus 1200 may be provided as one or more application specific integrated circuits (ASIC), field programmable gate arrays (FPGA), electrically erasable programmable read-only memories (EEPROM), programmable read-only memories (PROM), programmable logic devices (PLD), or read-only memory devices (ROM). In some embodiments, the apparatus 1200 may be implemented using one or more microprocessors, and an appropriate computer program product embodied in a machine-readable medium storing instructions, which when executed by a processor, implements the functions of the blocks shown. It should be noted that apparatus 1200 can form part of the encoders 273 and/or 277 of FIG. 4. However, as previously stated, other embodiments of the invention are not limited to a transmission system, and can be used for data storage and retrieval within a single computer or network.

It should be readily apparent to a person skilled in the art that FIG. 7 illustrates an embodiment for compressing data string, and that a corresponding decompression system uses the mapping function and the grammar to decompress the binary code word to reconstruct the original data string. Such a system can be implemented using similar blocks, and in a similar manner to the apparatus 1200, except the decompression system will not need a parser. As but one example, such an apparatus can form part of the decoder 103, or alternatively can be located within a network server or the host system 250. Furthermore, once again we note that such a decompression system can be used for data storage and retrieval within a single computer or network.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A method of generating a context model to be used for context-based compression comprising:
   a. determining file categorization criteria for a file to be compressed;
   b. determining an initial context model including an initial value for a current number of contexts and an initial context set based on the file categorization criteria;
   c. determining, for the initial context model, empirical statistics of contexts and symbols;
   d. using the empirical statistics to reduce the current number of contexts to a predetermined number of contexts, said predetermined number being smaller than said initial value; and
   e. generating the context model for mapping data elements to a set of contexts of size equal to said predetermined number of contexts.

2. The method as claimed in claim 1 wherein the step of determining said empirical statistics includes determining joint, conditional, and unconditional probabilities.

3. The method as claimed in claim 2 wherein step (d) comprises iteratively using said empirical statistics to incrementally reduce the current number of contexts until said current number of contexts equals the predetermined number of contexts.

4. The method as claimed in claim 3 wherein step (d) comprises applying a grouping function g to the set of contexts to combine the contexts into a smaller set of contexts.

5. The method as claimed in claim 4 wherein step (b) comprises determining an initial context length dependent on said file categorization criteria, and wherein the initial context set is derived based on the initial context length.

6. The method as claimed in claim 4 wherein step (b) comprises determining a size of an alphabet used in said file based on said determined file categorization criteria and then assigning an initial context length equal to a number of bits based on the number of bits needed to encode all elements of said alphabet; and wherein the initial context set is derived based on the initial context length.

7. The method as claimed in claim 4 further comprising determining a capacity based on at least one of memory and processing power of devices used in compressing and decompressing said file and setting said predetermined number of contexts to a number dependent on said capacity.

8. The method as claimed in claim 4 wherein said step of applying a grouping function g comprises:
   i. creating groupings of contexts from said initial set of contexts
   ii. calculating a conditional entropy for each grouping of contexts
   iii. selecting a reduced number of groupings based on said calculated conditional entropy; and
   iv. reducing a size of said initial set of contexts by replacing elements which comprise the selected groupings with said groupings.

9. The method as claimed in claim 4 wherein said step of applying a grouping function g comprises:
   i. creating groupings of contexts from said initial set of contexts;
   ii. calculating a conditional entropy for each grouping of contexts;
   iii. selecting a grouping with a lowest conditional entropy;
   iv. reducing a size of said set of contexts by replacing elements which comprise the selected grouping with said grouping; and
   v. repeating steps (i)-(iv) until a size of said set of contexts equals the predetermined number of contexts.

10. The method as claimed in claim 9 wherein step (c) comprises determining joint, conditional, and unconditional probabilities from a large set of data files having the same file categorization criteria as the determined file categorization.

11. The method as claimed in claim 9 wherein step (c) comprises determining the nth order empirical statistics from a large set of data files having the same file categorization criteria as the determined file categorization, where n is a prescribed parameter.

12. The method as claimed in claim 9 wherein said context model is used in a context-dependent grammar based compression process for compressing a sequence by parsing said sequence, and wherein the context set is such that a next context is determined from the current context and a current parsed phrase.

13. The method as claimed in claim 9 wherein said initial context model is a state machine context model and wherein said initial context model is used in a context-based YK compression process for compressing a sequence $x=x1x2 \ldots xm$ by parsing said sequence, and wherein the context set is chosen such that a next context from the context model is determined from the current context and a current parsed phrase.

14. The method as claimed in claim 9 wherein said initial context model is a state machine context model and wherein said context model is used in a context-based YK compression process for compressing a sequence $x=x1x2 \ldots xm$ by parsing said sequence, and wherein said step of creating grouping only creates groups such that when said groups are combined, a next context from the reduced set of contexts can still be determined from the current context and a current parsed phrase.

15. The method as claimed in claim 1 wherein said file categorization criteria includes any one of, or any combination of: file type, content type, language, and file structure.

16. The method of claim 1, further comprising, after step (e), iteratively repeating steps of:
 i. determining a current context model including the current number of contexts and the current set of contexts derived from a previously generated context model;
 ii. determining, for the current context model, current empirical statistics of contexts and symbols;
 iii. using the current empirical statistics to reduce the current number of contexts to a current desired number of contexts; and
 iv. revising the current context model for mapping data elements to a set of contexts of size equal to said current desired number of contexts.

* * * * *